United States Patent
Kalluru et al.

(10) Patent No.: US 8,710,909 B2
(45) Date of Patent: Apr. 29, 2014

(54) CIRCUITS FOR PREVENTION OF REVERSE LEAKAGE IN $V_{th}$-CANCELLATION CHARGE PUMPS

(75) Inventors: Vivek Venkata Kalluru, Bangalore (IN); Sridhar Yadala, Brookefields (IN); Sriganesh Chandrasekaran, Vattiyoorkavu (IN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/618,482

(22) Filed: Sep. 14, 2012

(65) Prior Publication Data

US 2014/0077868 A1 Mar. 20, 2014

(51) Int. Cl.
G05F 1/10 (2006.01)
H02M 3/07 (2006.01)

(52) U.S. Cl.
CPC ...................... *H02M 3/073* (2013.01)
USPC ........................................................ 327/536

(58) Field of Classification Search
USPC .................. 327/530, 534–537; 363/59, 60
See application file for complete search history.

(56) References Cited

U.S. PATENT DOCUMENTS

| | | |
|---|---|---|
| 3,697,860 A | 10/1972 | Baker |
| 4,511,811 A | 4/1985 | Gupta |
| 4,583,157 A | 4/1986 | Kirsch et al. |
| 4,636,748 A | 1/1987 | Latham |
| 4,736,121 A | 4/1988 | Cini et al. |
| 4,888,738 A | 12/1989 | Wong et al. |
| 5,140,182 A | 8/1992 | Ichimura |
| 5,168,174 A | 12/1992 | Naso et al. |
| 5,175,706 A | 12/1992 | Edme |
| 5,263,000 A | 11/1993 | Van Buskirk et al. |
| 5,392,205 A | 2/1995 | Zavaleta |
| 5,436,587 A | 7/1995 | Cernea |
| 5,483,434 A | 1/1996 | Seesink |
| 5,508,971 A | 4/1996 | Cernea et al. |
| 5,521,547 A | 5/1996 | Tsukada |
| 5,563,779 A | 10/1996 | Cave et al. |

(Continued)

FOREIGN PATENT DOCUMENTS

| | | |
|---|---|---|
| DE | 10 2007 02629 | 7/2008 |
| EP | 0 382 929 A | 8/1990 |

(Continued)

OTHER PUBLICATIONS

Feng Pan et al., "Charge Pump Circuit Design", McGraw-Hill, 2006, 26 pages.

(Continued)

*Primary Examiner* — Sibin Chen
(74) *Attorney, Agent, or Firm* — Davis Wright Tremaine LLP

(57) ABSTRACT

Techniques are presented to reduce reversion leakage in charge pump circuits. The exemplary circuit is a charge pump of the voltage doubler type, where the output of each leg is supplied through a corresponding output transistor. An auxiliary charge pump is used to supply the gates of the output transistors in order to cancel the threshold voltage of these output transistors. To reduce reverse leakage back through the output transistors, in each leg of the charge pump a switch is connected between the gate of the output transistor and the output level of the leg so the these levels can be shorted when that particular is not supplying the pump's output.

15 Claims, 8 Drawing Sheets

(56) References Cited

U.S. PATENT DOCUMENTS

| | | |
|---|---|---|
| 5,563,825 A | 10/1996 | Cernea et al. |
| 5,568,424 A | 10/1996 | Cernea et al. |
| 5,570,315 A | 10/1996 | Tanaka et al. |
| 5,592,420 A | 1/1997 | Cernea et al. |
| 5,596,532 A | 1/1997 | Cernea et al. |
| 5,602,794 A | 2/1997 | Javanifard et al. |
| 5,621,685 A | 4/1997 | Cernea et al. |
| 5,625,544 A | 4/1997 | Kowshik et al. |
| 5,693,570 A | 12/1997 | Cernea et al. |
| 5,732,039 A | 3/1998 | Javanifard et al. |
| 5,734,286 A | 3/1998 | Takeyama et al. |
| 5,767,735 A | 6/1998 | Javanifard et al. |
| 5,781,473 A | 7/1998 | Javanifard et al. |
| 5,801,987 A | 9/1998 | Dinh |
| 5,818,766 A | 10/1998 | Song |
| 5,828,596 A | 10/1998 | Takata et al. |
| 5,903,495 A | 5/1999 | Takeuchi et al. |
| 5,943,226 A | 8/1999 | Kim |
| 5,945,870 A | 8/1999 | Chu et al. |
| 5,969,565 A | 10/1999 | Naganawa |
| 5,973,546 A | 10/1999 | Le et al. |
| 5,982,222 A | 11/1999 | Kyung |
| 6,008,690 A | 12/1999 | Takeshima et al. |
| 6,018,264 A | 1/2000 | Jin |
| 6,023,187 A | 2/2000 | Camacho et al. |
| 6,026,002 A | 2/2000 | Viehmann |
| 6,046,935 A | 4/2000 | Takeuchi et al. |
| 6,104,225 A | 8/2000 | Taguchi et al. |
| 6,107,862 A | 8/2000 | Mukainakano et al. |
| 6,134,145 A | 10/2000 | Wong |
| 6,151,229 A | 11/2000 | Taub et al. |
| 6,154,088 A | 11/2000 | Chevallier et al. |
| 6,188,590 B1 | 2/2001 | Chang et al. |
| 6,198,645 B1 | 3/2001 | Kotowski et al. |
| 6,208,198 B1 | 3/2001 | Lee |
| 6,249,445 B1 | 6/2001 | Sugasawa |
| 6,249,898 B1 | 6/2001 | Koh et al. |
| 6,285,622 B1 | 9/2001 | Haraguchi et al. |
| 6,297,687 B1 | 10/2001 | Sugimura |
| 6,307,425 B1 | 10/2001 | Chevallier et al. |
| 6,314,025 B1 | 11/2001 | Wong |
| 6,320,428 B1 | 11/2001 | Atsumi et al. |
| 6,320,796 B1 | 11/2001 | Voo et al. |
| 6,329,869 B1 | 12/2001 | Matano |
| 6,344,959 B1 | 2/2002 | Milazzo |
| 6,344,984 B1 | 2/2002 | Miyazaki |
| 6,359,798 B1 | 3/2002 | Han et al. |
| 6,369,642 B1 | 4/2002 | Zeng et al. |
| 6,370,075 B1 | 4/2002 | Haeberli et al. |
| 6,385,107 B1 | 5/2002 | Bedarida et al. |
| 6,400,202 B1 | 6/2002 | Fifield et al. |
| 6,404,274 B1 | 6/2002 | Hosono et al. |
| 6,424,570 B1 | 7/2002 | Le et al. |
| 6,445,243 B2 | 9/2002 | Myono |
| 6,456,170 B1 | 9/2002 | Segawa et al. |
| 6,476,666 B1 | 11/2002 | Palusa et al. |
| 6,486,728 B2 | 11/2002 | Kleveland |
| 6,518,830 B2 | 2/2003 | Gariboldi et al. |
| 6,525,614 B2 | 2/2003 | Tanimoto |
| 6,525,949 B1 | 2/2003 | Johnson et al. |
| 6,531,792 B2 | 3/2003 | Oshio |
| 6,538,930 B2 | 3/2003 | Ishii et al. |
| 6,545,529 B2 | 4/2003 | Kim |
| 6,556,465 B2 | 4/2003 | Wong et al. |
| 6,577,535 B2 | 6/2003 | Pasternak |
| 6,606,267 B2 | 8/2003 | Wong |
| 6,724,241 B1 | 4/2004 | Bedarida et al. |
| 6,734,718 B1 | 5/2004 | Pan |
| 6,760,262 B2 | 7/2004 | Haeberli et al. |
| 6,781,440 B2 | 8/2004 | Huang |
| 6,798,274 B2 | 9/2004 | Tanimoto |
| 6,819,162 B2 | 11/2004 | Pelliconi |
| 6,834,001 B2 | 12/2004 | Myono |
| 6,859,091 B1 | 2/2005 | Nicholson et al. |
| 6,878,981 B2 | 4/2005 | Eshel |
| 6,891,764 B2 | 5/2005 | Li |
| 6,894,554 B2 | 5/2005 | Ito |
| 6,922,096 B2 | 7/2005 | Cernea |
| 6,927,441 B2 | 8/2005 | Pappalardo et al. |
| 6,933,768 B2 | 8/2005 | Hausmann |
| 6,944,058 B2 | 9/2005 | Wong |
| 6,975,135 B1 | 12/2005 | Bui |
| 6,990,031 B2 | 1/2006 | Hashimoto et al. |
| 6,995,603 B2 | 2/2006 | Chen et al. |
| 7,002,381 B1 | 2/2006 | Chung |
| 7,023,260 B2 | 4/2006 | Thorp et al. |
| 7,030,683 B2 | 4/2006 | Pan et al. |
| 7,113,023 B2 | 9/2006 | Cernea |
| 7,116,154 B2 | 10/2006 | Guo |
| 7,116,155 B2 | 10/2006 | Pan |
| 7,120,051 B2 | 10/2006 | Gorobets et al. |
| 7,129,759 B2 | 10/2006 | Fukami |
| 7,135,910 B2 | 11/2006 | Cernea |
| 7,135,911 B2 | 11/2006 | Imamiya |
| 7,205,682 B2 | 4/2007 | Kuramori |
| 7,208,996 B2 | 4/2007 | Suzuki et al. |
| 7,224,591 B2 | 5/2007 | Kaishita et al. |
| 7,227,780 B2 | 6/2007 | Komori et al. |
| 7,239,192 B2 | 7/2007 | Tailliet |
| 7,253,676 B2 | 8/2007 | Fukuda et al. |
| 7,259,612 B2 | 8/2007 | Saether |
| 7,276,960 B2 | 10/2007 | Peschke |
| 7,279,957 B2 | 10/2007 | Yen |
| 7,345,928 B2 | 3/2008 | Li |
| 7,368,979 B2 | 5/2008 | Govindu et al. |
| 7,397,677 B1 | 7/2008 | Collins et al. |
| 7,468,628 B2 | 12/2008 | Im et al. |
| 7,495,500 B2 | 2/2009 | Al-Shamma et al. |
| 7,521,978 B2 | 4/2009 | Kim et al. |
| 7,554,311 B2 | 6/2009 | Pan |
| 7,579,902 B2 | 8/2009 | Frulio et al. |
| 7,579,903 B2 | 8/2009 | Oku |
| 7,671,572 B2 | 3/2010 | Chung |
| 7,696,812 B2 | 4/2010 | Al-Shamma et al. |
| 7,772,914 B2 | 8/2010 | Jung |
| 7,795,952 B2 | 9/2010 | Lui et al. |
| 8,093,953 B2 | 1/2012 | Pierdomenico et al. |
| 8,193,853 B2 | 6/2012 | Hsieh et al. |
| 8,339,183 B2 * | 12/2012 | Htoo et al. ............... 327/536 |
| 2002/0008566 A1 | 1/2002 | Taito et al. |
| 2002/0014908 A1 | 2/2002 | Lauterbach |
| 2002/0075706 A1 | 6/2002 | Foss et al. |
| 2002/0130701 A1 | 9/2002 | Kleveland |
| 2002/0130704 A1 | 9/2002 | Myono et al. |
| 2002/0140463 A1 | 10/2002 | Cheung |
| 2003/0128560 A1 | 7/2003 | Saiki et al. |
| 2003/0214346 A1 | 11/2003 | Pelliconi |
| 2004/0046603 A1 | 3/2004 | Bedarida et al. |
| 2005/0030088 A1 | 2/2005 | Cernea |
| 2005/0093614 A1 | 5/2005 | Lee |
| 2005/0195017 A1 | 9/2005 | Chen et al. |
| 2005/0237103 A1 | 10/2005 | Cernea |
| 2005/0248386 A1 | 11/2005 | Pan et al. |
| 2006/0114053 A1 | 6/2006 | Sohara et al. |
| 2006/0244518 A1 | 11/2006 | Byeon et al. |
| 2006/0250177 A1 | 11/2006 | Thorp et al. |
| 2007/0001745 A1 | 1/2007 | Yen |
| 2007/0053216 A1 | 3/2007 | Alenin |
| 2007/0069805 A1 | 3/2007 | Choi et al. |
| 2007/0126494 A1 | 6/2007 | Pan |
| 2007/0139099 A1 | 6/2007 | Pan |
| 2007/0139100 A1 | 6/2007 | Pan |
| 2007/0210853 A1 | 9/2007 | Maejima |
| 2007/0211502 A1 | 9/2007 | Komiya |
| 2007/0222498 A1 | 9/2007 | Choy et al. |
| 2007/0229149 A1 | 10/2007 | Pan et al. |
| 2008/0024096 A1 | 1/2008 | Pan |
| 2008/0024198 A1 | 1/2008 | Bitonti et al. |
| 2008/0042731 A1 | 2/2008 | Daga et al. |
| 2008/0111604 A1 | 5/2008 | Boerstler et al. |
| 2008/0116963 A1 | 5/2008 | Jung |
| 2008/0136500 A1 | 6/2008 | Frulio et al. |
| 2008/0157852 A1 | 7/2008 | Pan |
| 2008/0157859 A1 | 7/2008 | Pan |

(56) References Cited

U.S. PATENT DOCUMENTS

| | | |
|---|---|---|
| 2008/0218134 A1 | 9/2008 | Kawakami et al. |
| 2008/0239802 A1 | 10/2008 | Thorp et al. |
| 2008/0239856 A1 | 10/2008 | Thorp et al. |
| 2008/0278222 A1 | 11/2008 | Conti et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |
| 2009/0058507 A1 | 3/2009 | Nandi et al. |
| 2009/0091366 A1 | 4/2009 | Baek et al. |
| 2009/0121780 A1 | 5/2009 | Chen et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Raghavan |
| 2009/0174441 A1 | 7/2009 | Gebara et al. |
| 2009/0184697 A1 | 7/2009 | Park |
| 2009/0219077 A1 | 9/2009 | Pietri et al. |
| 2009/0315598 A1 | 12/2009 | Namekawa |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0033232 A1 | 2/2010 | Pan |
| 2010/0074034 A1 | 3/2010 | Cazzaniga |
| 2010/0085794 A1 | 4/2010 | Chen et al. |
| 2010/0244935 A1 | 9/2010 | Kim et al. |
| 2010/0302877 A1 | 12/2010 | Bang |
| 2011/0026329 A1 | 2/2011 | Wada |
| 2011/0156803 A1 | 6/2011 | Yap et al. |
| 2011/0176370 A1 | 7/2011 | Izumi et al. |
| 2011/0254615 A1* | 10/2011 | Raghunathan et al. ....... 327/536 |

FOREIGN PATENT DOCUMENTS

| | | |
|---|---|---|
| EP | 0 780 515 A | 6/1997 |
| WO | 01/06336 A1 | 1/2001 |
| WO | WO 2006/132757 | 12/2006 |

OTHER PUBLICATIONS

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

U.S. Appl. No. 12/506,998 entitled "Cahrge Pump with Current Based Regulation" filed Jul. 21, 2009, 21 pages.

U.S. Appl. No. 12/634,385 entitled "Multi-Stage Charge Pump with Variable Number of Boosting Stages" filed Dec. 9, 2009, 33 pages.

* cited by examiner

Charging Half Cycle

Transfer Half Cycle

CIRCUITS FOR PREVENTION OF REVERSE LEAKAGE IN $V_{th}$-CANCELLATION CHARGE PUMPS

FIELD OF THE INVENTION

This invention pertains generally to the field of charge pumps and more particularly to improving their efficiency.

BACKGROUND

Charge pumps use a switching process to provide a DC output voltage larger or lower than its DC input voltage. In general, a charge pump will have a capacitor coupled to switches between an input and an output. During one clock half cycle, the charging half cycle, the capacitor couples in parallel to the input so as to charge up to the input voltage. During a second clock cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

Charge pumps are used in many contexts. For example, they are used as peripheral circuits on flash and other non-volatile memories to generate many of the needed operating voltages, such as programming or erase voltages, from a lower power supply voltage. A number of charge pump designs, such as conventional Dickson-type pumps, are know in the art. FIG. 2 shows a 2 stage, 2 branch version of a conventional Dickson type charge pump that receives Vcc as its input voltage on the left and generates from it an output voltage on the right. The top branch has a pair of capacitors 303 and 307 with top plates connected along the branch and bottom plates respectively connected to the non-overlapping clock signals CLK1 and CLK2. The capacitors 303 and 307 are connected between the series of transistors 301, 305, and 309, which are all diode connected to keep the charge from flowing back to the left. The bottom branch is constructed of transistors 311, 315, and 319 and capacitors 313 and 317 arranged in the same manner as the top branch, but with the clocks reversed so the two branches will alternately drive the output.

$V_{TH}$-cancellation pumps can be used to replace the traditional Dickson charge pumps with diode connected switches for better efficiency and strong IV characteristics, because the $V_{TH}$-drop in each stage of a Dickson charge pump is offset by boosting the gate of the transfer switch to a higher voltage through an auxiliary pump. However this kind of architecture has an inherent reverse leakage issue when the pump is supposed to deliver very high currents, such as where a large capacitance is instantaneously connected to the output of the pump. The reverse leakage issue hampers pump recovery time and causes power loss. Consequently, such $V_{TH}$-cancellation pumps could benefit from ways to reduce this revers leakage problem.

SUMMARY OF THE INVENTION

According to a first set of aspects, a charge pump circuit generates an output voltage. The charge pump circuit includes an output generation section, an offset cancellation section, and first and second output transistors. The output generation section has a first leg receiving a first clock signal and providing a first output and has a second leg receiving a second clock signal and providing a second output, wherein the first and second clock signals are non-overlapping. The first and second outputs of the first and second output generation section's legs are respectively connected through the first and second output transistors to provide the output voltage. The offset cancellation section has a first leg providing a first offset cancellation output and has a second leg having a second offset cancellation output, where the first and second offset cancellation outputs of the output generation section are respectively connected to the control gate of the first and second output transistors. When the first and second offset cancellation outputs are high, the first and second outputs of the output generation section are respectively high; and when the first and second outputs of the output generation section are low, the first and second offset cancellation outputs are respectively low. The charge pump circuit also includes first and second shorting transistors. The first shorting transistor is connected between the first output of the output generation section and the control gate of the first output transistor and has a gate connected to the gate of the second output transistor. The second shorting transistor is connected between the second output of the output generation section and the control gate of the second output transistor and has a gate connected to the gate of the first output transistor.

Another set of aspects concern a method of reducing leakage in a charge pump circuit. The method includes receiving an input voltage, receiving a first clock at a first branch of a first charge pump section and generating from it a first output from the input voltage, and receiving a second clock signal at a second branch of the first charge pump section and generating from it a second output from the input voltage. The first and second clock signals are non-overlapping. The method also includes receiving a third clock at a first branch of a second charge pump section and generating therefrom a third output from the input voltage and receiving a fourth clock signal at a second branch of the second charge pump section and generating therefrom a fourth output from the input voltage. The first and second charge pump sections have the same structure. The first clock signal is high when the third clock signal is high and the third clock signal is low when the first clock signal is low. The second clock signal is high when the fourth clock signal is high and the fourth clock signal is low when the second clock signal is low. The third and fourth outputs are applied to the control gates of first and second transistors, respectively, where the first and second transistors are respectively connected between the first and second outputs of the first charge pump section and the output of the charge pump circuit. The fourth and third outputs are applied to the control gates of third and fourth transistors, respectively, wherein the third transistor is connected between the first output and the third output and the fourth transistor is connected between the second output and the fourth output.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

Figure 1A:
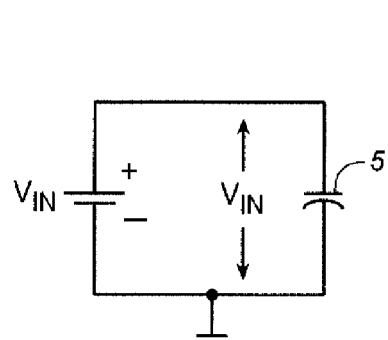
FIG. 1a is a simplified circuit diagram of the charging half cycle in a generic charge pump.
Figure 1B:
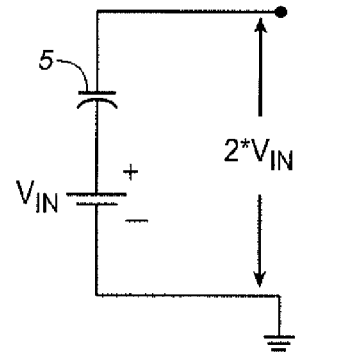
FIG. 1b is a simplified circuit diagram of the transfer half cycle in a generic charge pump.
Figure 2:
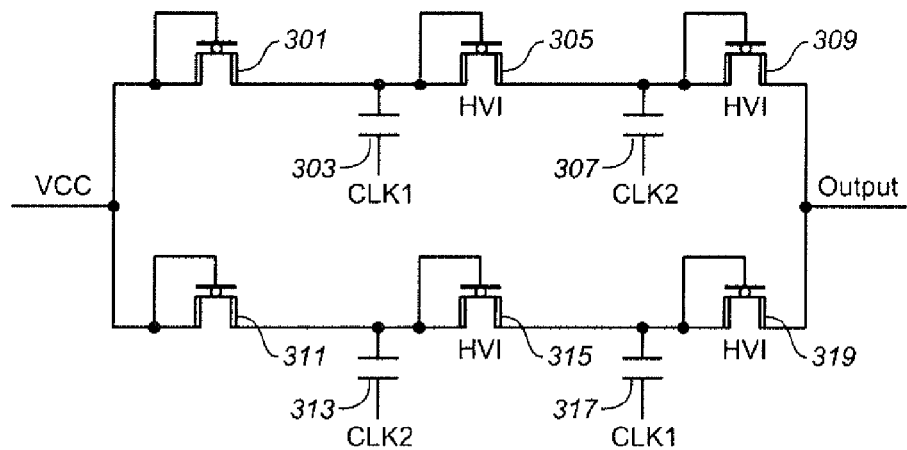
FIG. 2 shows a 2 stage, 2 branch version of a conventional Dickson type charge pump.
Figure 3A:
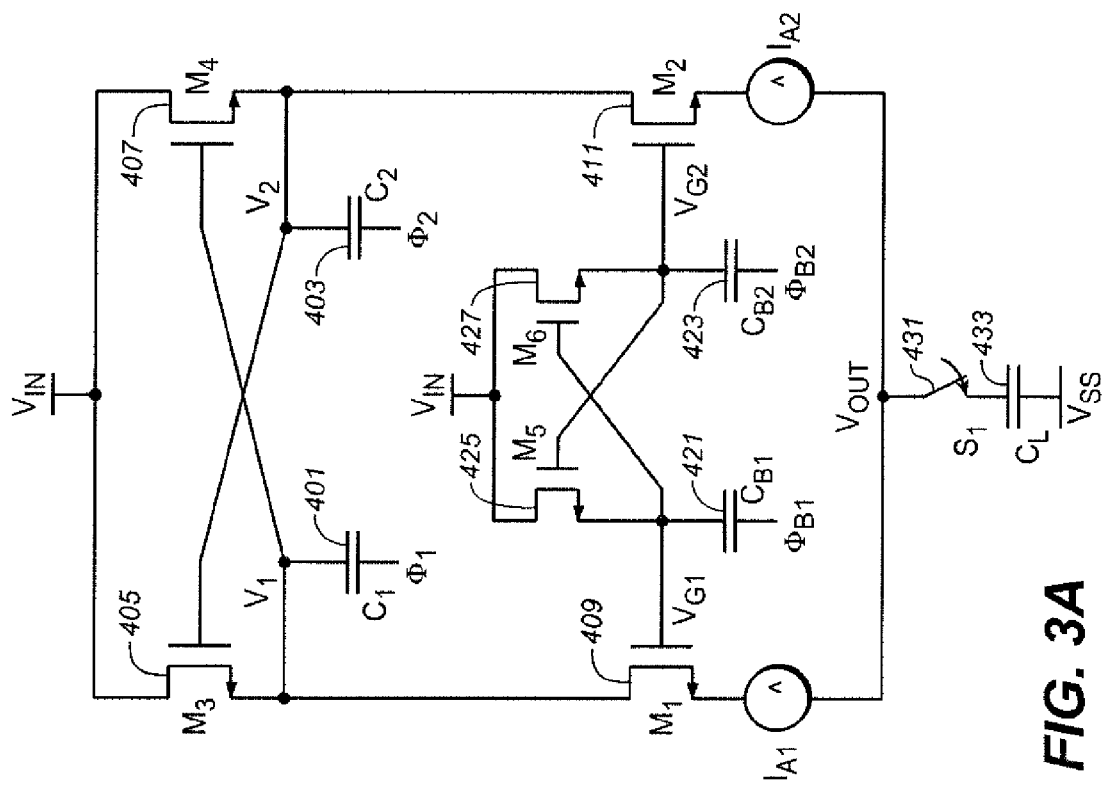
FIG. 3A is a schematic of a voltage double type of charge pump with $V_{TH}$ cancellation.
Figures 3B, 3C:
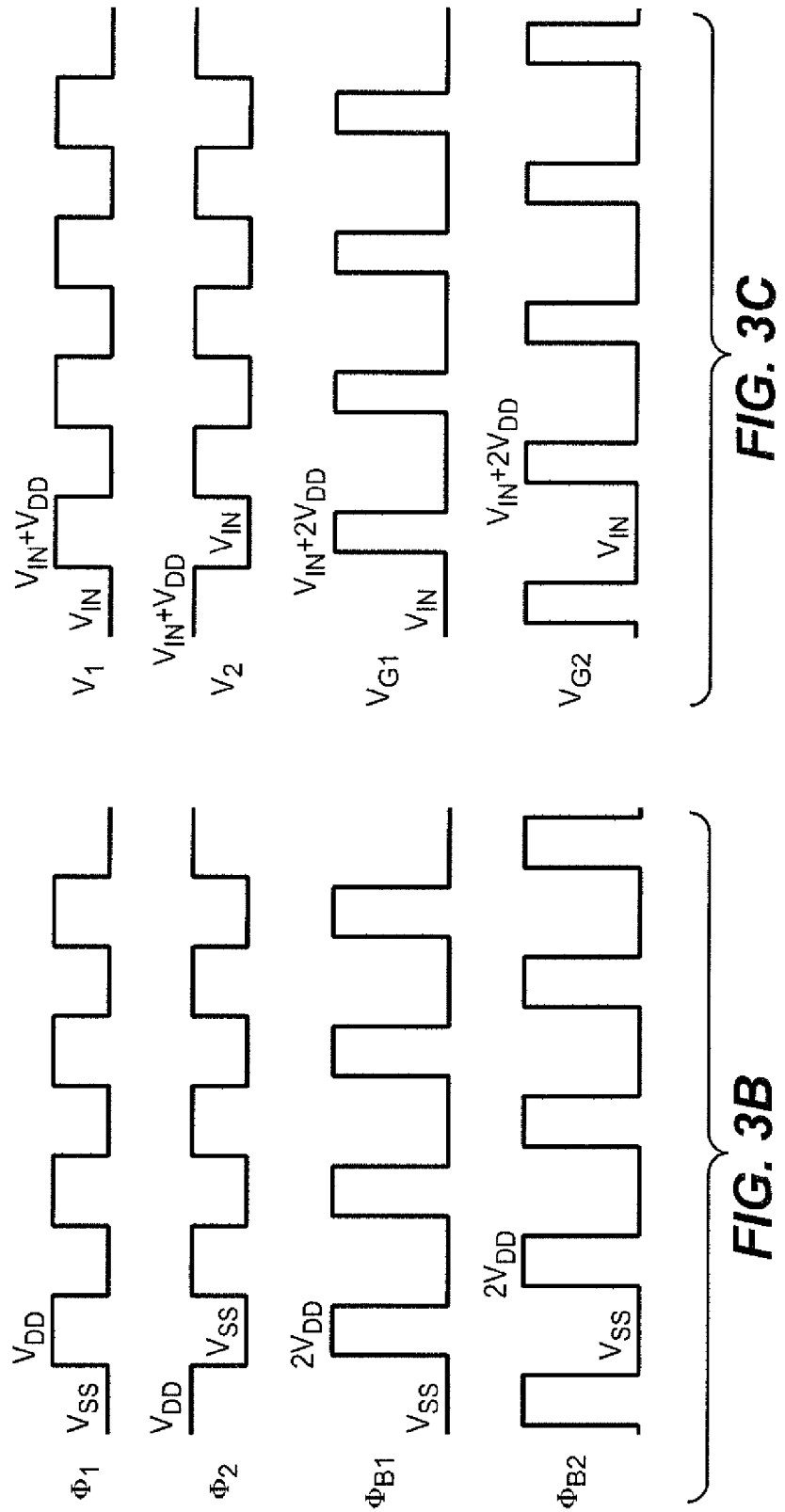
FIGS. 3B and 3C illustrate a clock scheme and typical node voltages for the device of FIG. 3A.

A typical doubler-based charge pump stage is shown in FIG. 3A, with a corresponding clock scheme shown in FIG. 3B. Pump capacitors $C_1$ 401 and $C_2$ 403 get charged through switches $M_3$ 405 and $M_4$ 407, respectively, to a voltage $V_{IN}$ during phase $\Phi_2/\Phi_1$ respectively. This voltage is then boosted by a voltage $V_{DD}$ by using clocks, $\Phi_1/\Phi_2$, and passed on to $V_{OUT}$ through switches $M_1$ 409/$M_2$ 411 respectively. To minimize the drop across switches $M_1$ 409 and $M_2$ 411, a higher voltage is used at nodes $V_{G1}/V_{G2}$, which are in turn obtained through a separate auxiliary pump using pump capacitors $C_{B1}$ 421, $C_{B2}$ 422 and along with boosted clocks, $\Phi_{B1}/\Phi_{B2}$ to boost $V_{IN}$ by $2V_{DD}$. Typical node voltages are shown in FIG. 3C.

A common application of a charge pump is to supply a high-voltage bias to very large capacitive load, represented $C_L$ 433. An example of this is when the charge pump is a peripheral element of a flash EEPROM memory circuit. This load is typically switched ON (here represented by closing a switch $S_1$ 431) after the charge pump reaches steady state, causing a significant voltage drop on the output $V_{OUT}$. The time taken for the charge pump to reach steady-state again is termed the recovery time. Voltage doubler-based architectures suffer from a slow recovery compared to the Dickson-type architectures due to a reverse-leakage phenomenon that is absent in Dickson-type architectures.

Figure 4:
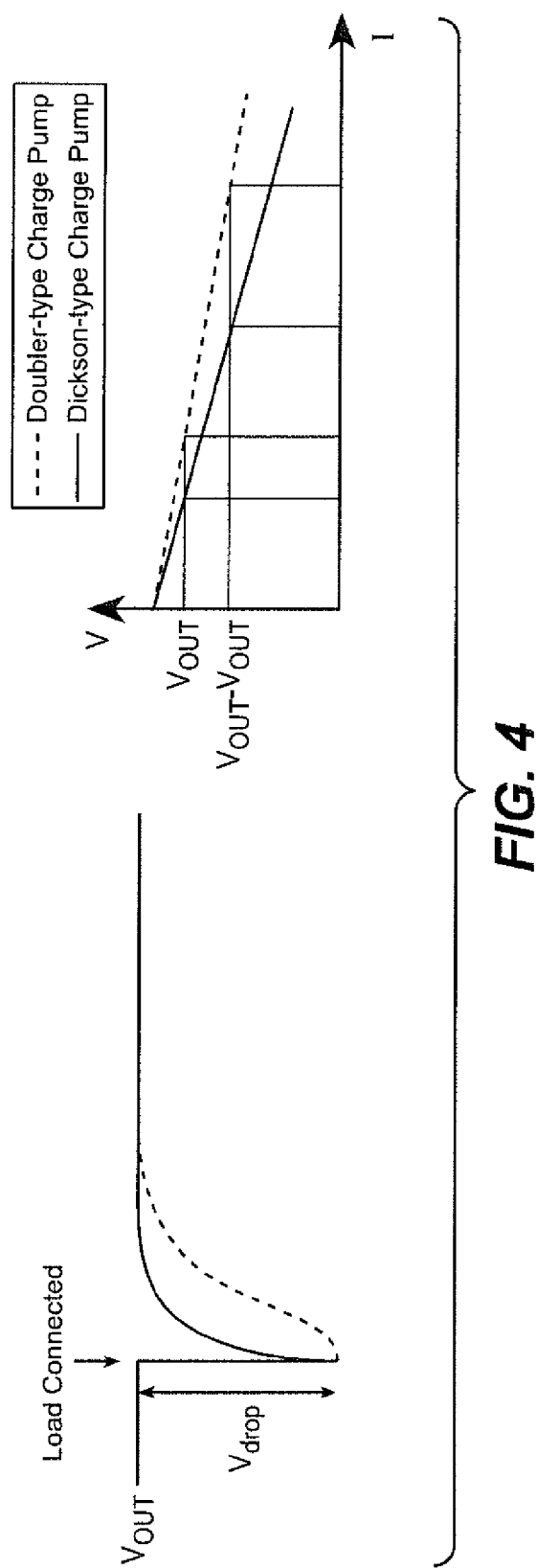
FIG. 4 shows a recovery time profile, transient response and I-V curves

To explain this phenomenon, consider a charge pump in steady-state. When switch $M_1$ 409 is ON, consider a very large capacitor $C_L$ 433 connected suddenly to the node $V_{OUT}$ using switch $S_1$ 431. The pump capacitor $C_1$ 401 loses charge instantaneously to $C_L$ 433, causing the voltage $V_{OUT}$ to drop by some voltage, say $V_{drop}$. This charge lost to the load should be replenished in the next phase from the supply $V_{IN}$ through the switch $M_3$ 405, during which time the switch $M_1$ 409 should be completely OFF. Since there is no discharge path for the auxiliary pump capacitor, $C_{B1}$ 421, it loses no charge and $V_{G1}$ still stays at $V_{IN}$, whereas $V_1$ has dropped to $V_{IN}-V_{drop}$. For an appreciable drop, this switch, $M_1$ 409, starts conducting and enables an alternate current path from the output node back into the pump capacitor, $C_1$ 401. This slows down the voltage build-up on $V_{OUT}$ as charge from $C_L$ 433 leaks back into the pump and the recovery time increases. Though the charge is not lost and goes back into the pump capacitor, switching losses in this reverse-leakage path attribute to increased power consumption during recovery. This is the reverse-leakage issue addressed in the following. A typical recovery profile for both types of charge pump is shown in FIG. 4.

More information on prior art charge pumps, such as Dickson type pumps, and charge pumps generally, can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; 7,795,952; 7,135,910; 7,973,592; and 7,969,235; US Patent Publication numbers 2009-0153230-A1; 2009-0153232-A1; 2009-0315616-A1; 2009-0322413-A1; 2009-0058506-A1; US-2011-0148509-A1; 2007-0126494-A1; 2007-0139099-A1; 2008-0307342 A1; and 2009-0058507 A1; and application Ser. Nos. 12/973,641 and 12/973,493, both filed Dec. 20, 2010, and Ser. No. 13/228,605, filed Sep. 9, 2011. More detail on voltage cancellation pumps, including multi-stage arrangements, can be found in U.S. Pat. No. 7,969,235.

The basic idea is to somehow short the nodes $V_1$ and $V_{G1}$ when $M_2$ 411 is ON, thereby guaranteeing that $M_1$ 409 is turned OFF; but the circuit also needs to ensure that this new switch should be open when $M_1$ 409 is intended to be ON, thereby preventing loss of charge from $C_{B1}$ 421 during intended operation. There are several embodiments described in the following to do this.

Figure 5:
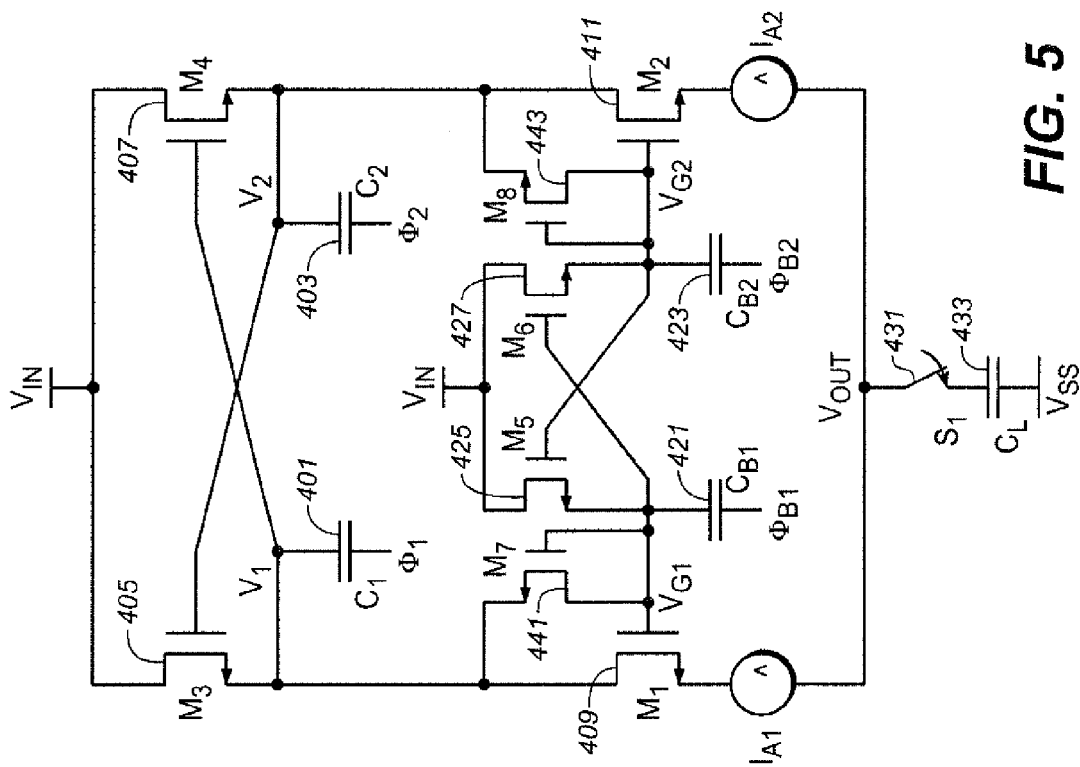
FIGS. 5-7 show embodiments of $V_{TH}$ cancellation charge pumps having reduced reverse leakage.

A first embodiment uses the addition of weak diodes $M_7$ 441/$M_8$ 443 between $V_{G1}/V_{G2}$ and $V_1/V_2$, respectively, as shown in FIG. 5. Consider when the pump in steady-state and in the $\Phi_1$ phase: When $C_L$ 433 is suddenly connected through the switch $S_1$ 431, $V_1$ drops suddenly but $V_{G1}$ does not. When the pump shifts to phase $\Phi_2$, since the diode $M_7$ 441 is forward-biased, $V_{G1}$ and $V_1$ equalizes quickly until $V_1=V_{G1}-V_{TH}$ and hence $M_1$ 409 is shut OFF thereby preventing reverse leakage. Since the diode is forward-biased during phase $\Phi_1$ also, it has to be a weak diode. The drop in $V_{G1}$ due to the forward-biased diode $M_7$ 441 during phase $\Phi_1$ is minute and even this small amount of charge lost by $C_{B1}$ 421 is gained back by $C_1$ 401 and $C_L$ 433. Hence, the drop in power efficiency is minimal. The recovery time now improves as the reverse-leakage path is cut off and there is more charge transferred from $C_1$ 401 to $C_L$ 433 in each clock cycle. The power efficiency is also better as the dynamic losses due to the reverse-leakage path are absent.

Figures 6, 7:
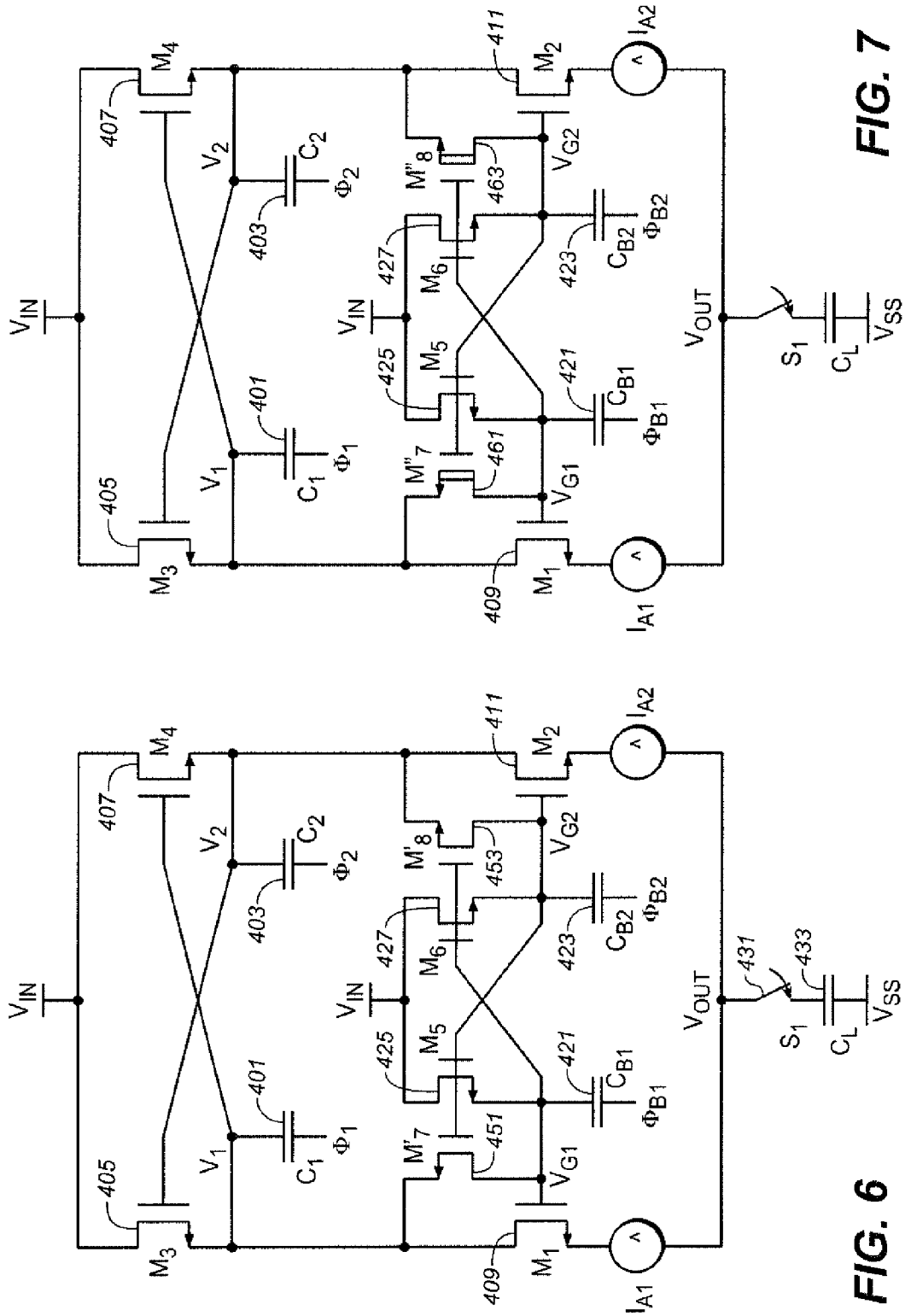

A second embodiment adds switches $M'_7$ 451/$M'_8$ 453 between $V_{G1}/V_{G2}$ and $V_1/V_2$ respectively as shown in FIG. 6. The switches $M'_7$ 451/$M'_8$ 453 are driven by the opposite phase clocks, $V_{G2}/V_{G1}$ respectively. Consider the pump of FIG. 6 in steady-state and in the $\Phi_1$ phase: When $C_L$ 433 is suddenly connected through the switch $S_1$ 431, $V_1$ drops suddenly but $V_{G1}$ does not. When the pump shifts to phase $\Phi_2$, the switch $M'_7$ 451 is turned ON strongly, as its gate-source voltage ($V_{GS}$) level is close to $2V_{DD}$, thereby shorting $V_1$ and $V_{G1}$. This causes the $V_{GS}$ of $M_1$ 409 to be ZERO and hence, the reverse leakage path is cut off. Back in phase $\Phi_1$, $V_{G2}$ drops by $2V_{DD}$ and the switch $M'_7$ 451 is turned OFF completely, as long as the drop in voltage $V_1$ is not very drastic ($>V_{DD}+V_{TH}$). Hence, there is no drop in $V_{G1}$ during phase $\Phi_1$ and the driving capability of switch $M_1$ 401 is unaltered. It is worth noting that there is no possibility for the switches $M'_7$ 451/$M'_8$ 453 to turn ON accidentally as $\Phi_{B1}/\Phi_{B2}$ are non-overlapping clocks by design. For designs working on the limit due to area constraints, a minute loss of driving capability in switches $M_1$ 409/$M_2$ 411 cannot be tolerated and this new design will help in such cases. A disadvantage of this embodiment relative to that to be discussed next is that it takes some time to cut-off the reverse-leakage path due to the non-overlap time between the boosted clocks $\Phi_{B1}/\Phi_{B2}$. Hence, some degree of reverse leakage can occur.

Another embodiment, shown in FIG. 7, uses depletion-type devices M"$_7$ 461/M"$_8$ 463 instead of enhancement-type devices M'$_7$ 451/M'$_8$ 453 of FIG. 6 for the sorting switches. This causes these switches turn ON immediately after the removal of boosted clocks $\Phi_{B1}/\Phi_{B2}$, thereby cutting off the reverse-leakage path from the outset. M"$_7$ 461 is weakly ON when $\Phi_{B1}$ is removed and strongly ON when $\Phi_{B2}$ is applied. However, during phase $\Phi_1$, the switch M"$_7$ 461 starts conducting if the voltage drop exceeds a certain level ($>V_{DD}-|V_{TH}|$). This can be preferable when the drop in voltage is not too much, i.e.; as long as $C_1$ 401/$C_2$ 403 is comparable to $C_L$ 433.

Figure 8A:
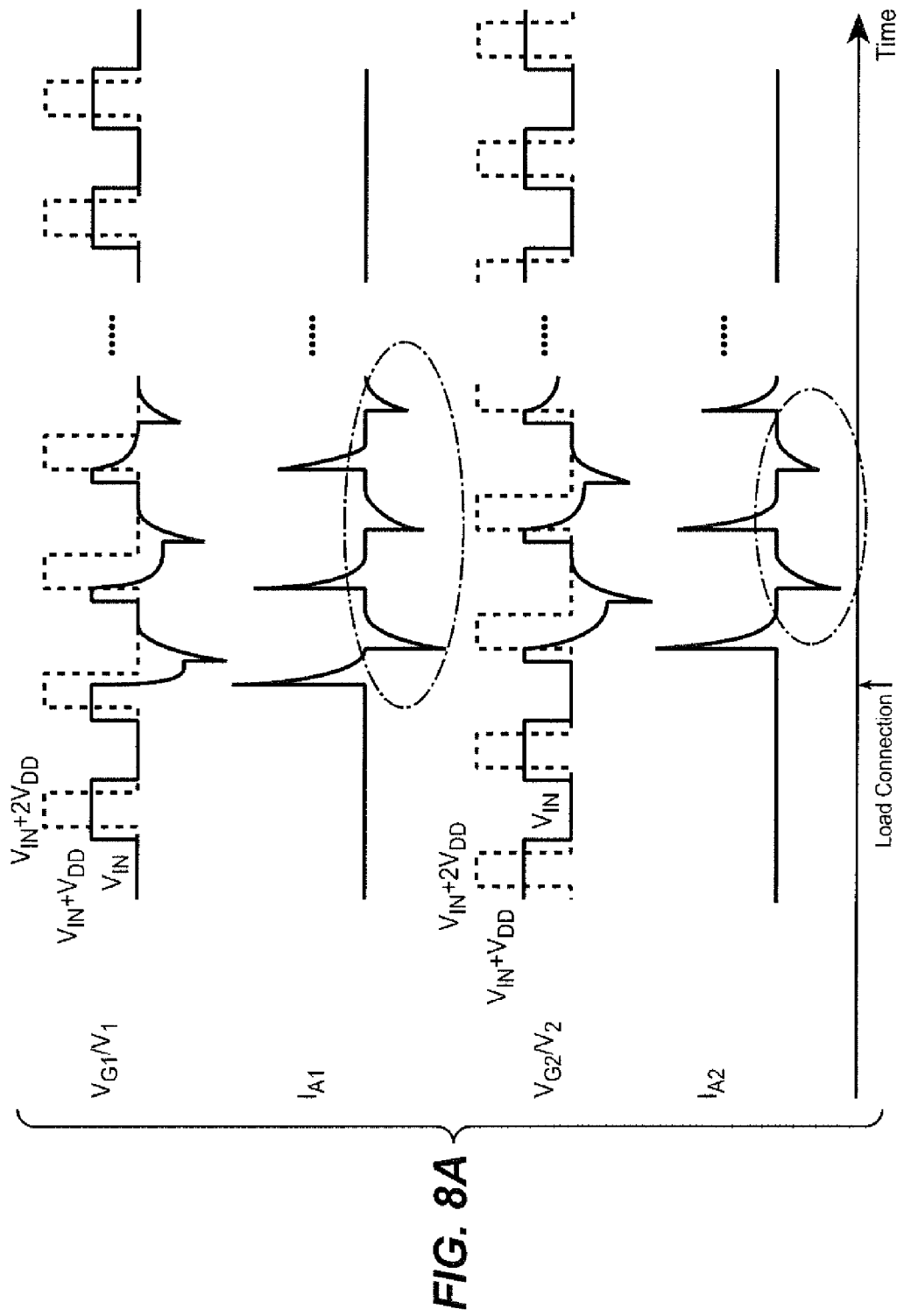
FIGS. 8A and 8B illustrate voltage and current levels for the circuits of FIGS. 3A and 7, respectively.
Figure 8B:
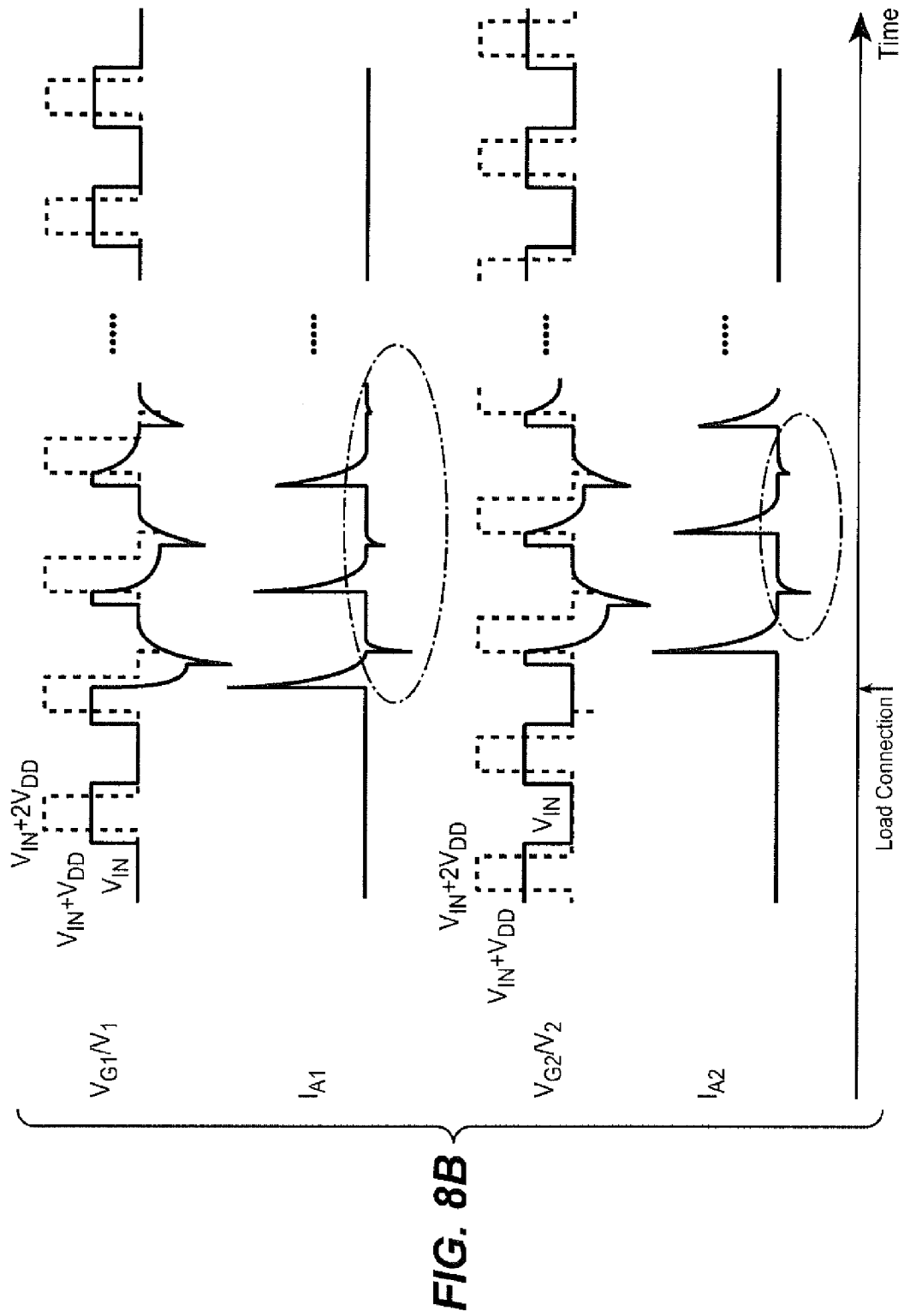

A graphical depiction of the operation of the embodiment of FIG. 7 is shown in FIGS. 8A and 8B. FIG. 8A shows the voltage and current profiles for a typical doubler-type charge pump such as in FIG. 3, whereas FIG. 8B shows the voltage and current profiles for the modified charge pump of FIG. 7. The charge needed to be transferred to the output in both cases is $\int(I_{A1}+I_{A2})*dt$. As shown in FIG. 8B, the negative components (reverse current) of $I_{A1}/I_{A2}$ have been reduced greatly, thereby transferring more charge to the output every cycle and reducing the recovery-time.

The embodiments described above address the reverse leakage issue in doubler-type charge pump architectures. Depending on the charge pump application and design constraints, the preferred embodiment can be chosen for the charge pump. Compared to previous charge pump circuits, the embodiments described here can provide a ramp-up time comparable to the Dickson-type charge pumps, similar I-V performance, and better power efficiency. Charge pump architectures are typically optimized keeping the steady-state performance in mind so as to reduce power consumption, area, or both. Doubler-type charge pump architectures with $V_{TH}$-cancellation offer distinctly better performance than their Dickson-type architecture equivalents; but the dynamic performance of the pump (ramp-up, recovery-time) is adversely affected and can make it unsuitable for sensitive applications where the Dickson-type architecture may be chosen. The techniques presented here improve the dynamic performance of doubler-type charge pumps along with ensuring better power efficiency, making them comparable to the Dickson-type charge pumps and thereby providing high levels of both steady-state performance and dynamic performance in the same voltage doubler-type charge pump architecture.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A charge pump circuit to generate an output voltage, including:
    an output generation section having a first leg receiving a first clock signal and providing a first output and a second leg receiving a second clock signal and providing a second output, wherein the first and second clock signals are non-overlapping;
    first and second output transistors, wherein the first and second outputs of the first and second legs of the output generation section are respectively connected through the first and second output transistors to provide the output voltage;
    an offset cancellation section having a first leg providing a first offset cancellation output and a second leg having a second offset cancellation output, where the first and second offset cancellation outputs of the output generation section are respectively connected to the control gate of the first and second output transistors, wherein when the first and second offset cancellation outputs are high the first and second outputs of the output generation section are respectively high, and wherein when the first and second outputs of the output generation section are low the first and second offset cancellation outputs are respectively low; and
    first and second shorting transistors, the first shorting transistor being connected between the first output of the output generation section and the control gate of the first output transistor and having a gate connected to the gate of the second output transistor, and the second shorting transistor connected between the second output of the output generation section and the control gate of the second output transistor and having a gate connected to the gate of the first output transistor.

2. The charge pump circuit of claim 1, wherein the transistors of the first and second shorting transistors are depletion type devices.

3. The charge pump circuit of claim 1, wherein the transistors of the first and second shorting transistors are enhancement type devices.

4. The charge pump circuit of claim 1, wherein the output generation section and the offset cancellation section have the same structure, where the first second legs of the output cancellation section are respectively connected to receive third and fourth clock signals,
    wherein the first clock signal is high when the third clock signal is high and the third clock signal is low when the first clock signal is low, and wherein the second clock signal is high when the fourth clock signal is high and the fourth clock signal is low when the second clock signal is low.

5. The charge pump circuit of claim 4, wherein the third and fourth clock signals are of greater amplitude that the first and second clock signals.

6. The charge pump circuit of claim 4, wherein the first and second legs of both the output generation section and the offset cancellation section respectively include a first and a second capacitor, where the first clock signal is supplied to a plate of the first capacitor of the output generation section and the second clock signal is supplied to a plate of the second capacitor of the output generation section, and
    where the third clock signal is supplied to a plate of the first capacitor of the offset cancellation section and the fourth clock signal is supplied to a plate of the second capacitor of the offset cancellation section.

7. The charge pump circuit of claim 4, wherein the sections have a voltage doubler-type of structure.

8. The charge pump circuit of claim 7, wherein for the output generation section the first leg comprises:
    a first transistor connected between an input voltage and a first output node from which the first output is provided, wherein a plate of the first capacitor not connected to receive the first clock signal is connected to the first output node; and
    the second leg comprises:

a second transistor connected between the input voltage and a second output node from which the second output is provided, wherein a plate of the second capacitor not connected to receive the second clock signal is connected to the second output node, wherein the gate of the first transistor is connected to the second output node and the gate of the second transistor is connected to the first output node, and wherein for the offset cancellation section the first leg comprises:

a first transistor connected between the input voltage and a first output node from which the first output is provided, wherein a plate of the first capacitor not connected to receive the third clock signal is connected to the first output node; and the second leg comprises:

a second transistor connected between the input voltage and a second output node from which the second output is provided, wherein a plate of the second capacitor not connected to receive the second clock signal is connected to the fourth output node, wherein the gate of the first transistor is connected to the second output node and the gate of the second transistor is connected to the first output node.

9. A method of reducing leakage in a charge pump circuit, comprising:

receiving an input voltage;

receiving a first clock at a first branch of a first charge pump section and generating therefrom a first output from the input voltage;

receiving a second clock signal at a second branch of the first charge pump section and generating therefrom a second output from the input voltage, wherein the first and second clock signals are non-overlapping;

receiving a third clock at a first branch of a second charge pump section and generating therefrom a third output from the input voltage;

receiving a fourth clock signal at a second branch of the second charge pump section and generating therefrom a fourth output from the input voltage, where the first and second charge pump sections have the same structure, wherein the first clock signal is high when the third clock signal is high and the third clock signal is low when the first clock signal is low, and wherein the second clock signal is high when the fourth clock signal is high and the fourth clock signal is low when the second clock signal is low;

applying the third and fourth outputs to the control gates of first and second transistors, respectively, wherein the first and second transistors are respectively connected between the first and second outputs of the first charge pump section and the output of the charge pump circuit; and applying the fourth and third outputs to the control gates of third and fourth transistors, respectively, wherein the third transistor is connected between the first output and the third output and the fourth transistor is connected between the second output and the fourth output.

10. The method of claim 9, wherein the transistors of fourth and third transistors are depletion type devices.

11. The method of claim 9, wherein the transistors of the fourth and third transistors are enhancement type devices.

12. The method of claim 9, wherein the first and second charge pump sections have the same structure, and wherein the first clock signal is high when the third clock signal is high and the third clock signal is low when the first clock signal is low, and wherein the second clock signal is high when the fourth clock signal is high and the fourth clock signal is low when the second clock signal is low.

13. The method of claim 12, wherein the third and fourth clock signals are of greater amplitude that the first and second clock signals.

14. The method of claim 12, wherein the first and second legs of both the first and second charge pump sections respectively include a first and a second capacitor, where the first clock signal is supplied to a plate of the first capacitor of the first charge pump section and the second clock signal is supplied to a plate of the second capacitor of the first charge pump section, and where the third clock signal is supplied to a plate of the first capacitor of the second charge pump section and the fourth clock signal is supplied to a plate of the second capacitor of the first charge pump section.

15. The method of claim 12, wherein the first and second charge pump sections have a voltage doubler-type of structure.

* * * * *